United States Patent
Van Bommel et al.

(10) Patent No.: US 12,449,102 B2
(45) Date of Patent: Oct. 21, 2025

(54) LED FILAMENT

(71) Applicant: SIGNIFY HOLDING B.V., Eindhoven (NL)

(72) Inventors: Ties Van Bommel, Horst (NL); Rifat Ata Mustafa Hikmet, Eindhoven (NL); Evren Özcan, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 18/847,345

(22) PCT Filed: Mar. 10, 2023

(86) PCT No.: PCT/EP2023/056165
§ 371 (c)(1),
(2) Date: Sep. 16, 2024

(87) PCT Pub. No.: WO2023/174818
PCT Pub. Date: Sep. 21, 2023

(65) Prior Publication Data
US 2025/0216038 A1    Jul. 3, 2025

(30) Foreign Application Priority Data

Mar. 17, 2022 (EP) .................................... 22162750

(51) Int. Cl.
*F21V 3/08* (2018.01)
*F21K 9/64* (2016.01)
(Continued)

(52) U.S. Cl.
CPC .................. *F21K 9/64* (2016.08); *F21K 9/65* (2016.08); *F21V 3/08* (2018.02); *F21V 9/08* (2013.01); *F21Y 2115/10* (2016.08)

(58) Field of Classification Search
None
See application file for complete search history.

(56) References Cited

U.S. PATENT DOCUMENTS

| | | | |
|---|---|---|---|
| 11,624,494 B2 * | 4/2023 | Newell | G03B 21/204 362/84 |
| 2010/0117106 A1 * | 5/2010 | Trottier | H10H 20/8516 438/22 |

(Continued)

FOREIGN PATENT DOCUMENTS

| | | |
|---|---|---|
| CN | 103855143 A | 6/2014 |
| CN | 105042354 A | 11/2015 |

(Continued)

*Primary Examiner* — William J Carter

(57) ABSTRACT

A light-emitting diode, LED, filament (1) is disclosed, comprising a plurality of LEDs (2) configured to, in operation, emit LED light, and an elongated carrier (3) comprising a major surface (4) on which the plurality of LEDs (2) are arranged. The LED filament (1) comprises a first enclosing structure (5), comprising a first body (6) arranged to receive at least some of the LED light emitted by the plurality of LEDs (2), convey it through the first body (6) and output first LED light, and a second enclosing structure (7), comprising a second body (8) arranged to receive at least some of the first LED light, convey it through the second body (8) and output second LED light, wherein the second body (8) comprises one or more wavelength-converting elements. A thickness (T1) of the first enclosing structure (5) is larger than a thickness (T2) of the second enclosing structure (7) multiplied by two.

14 Claims, 4 Drawing Sheets

(51) Int. Cl.
     *F21K 9/65*          (2016.01)
     *F21V 9/08*          (2018.01)
     *F21Y 115/10*       (2016.01)

(56) References Cited

U.S. PATENT DOCUMENTS

| | | | | |
|---|---|---|---|---|
| 2011/0170277 A1* | 7/2011 | Li | ............................ | F21V 13/14 |
| | | | | 362/84 |
| 2012/0153311 A1* | 6/2012 | Yuan | ......................... | F21K 9/90 |
| | | | | 264/2.7 |
| 2013/0182444 A1* | 7/2013 | Ostergaard | ........... | H10H 20/854 |
| | | | | 362/296.09 |
| 2013/0258637 A1* | 10/2013 | Wang | ................. | H10H 20/8514 |
| | | | | 362/84 |
| 2015/0219936 A1* | 8/2015 | Kim | .................. | G02F 1/133603 |
| | | | | 977/950 |
| 2021/0270443 A1* | 9/2021 | Yun | ............................ | F21V 9/30 |

FOREIGN PATENT DOCUMENTS

| | | | |
|---|---|---|---|
| CN | 205065404 U | 3/2016 | |
| CN | 206001295 U | 3/2017 | |
| CN | 108506746 A | 9/2018 | |
| CN | 207962121 U | 10/2018 | |
| EP | 2413029 A2 | 2/2012 | |
| EP | 2535640 A1 | 12/2012 | |
| TW | 201221847 A | 6/2012 | |
| WO | 2022268700 A1 | 12/2022 | |

\* cited by examiner

LED FILAMENT

CROSS-REFERENCE TO PRIOR APPLICATIONS

This application is the U.S. National Phase application under 35 U.S.C. § 371 of International Application No. PCT/EP2023/056165, filed on Mar. 10, 2023, which claims the benefit of European Patent Application No. 22162750.8, filed on Mar. 17, 2022. These applications are hereby incorporated by reference herein.

TECHNICAL FIELD

The present invention relates to a light-emitting diode (LED) filament comprising an elongated carrier and a plurality of light-emitting diodes arranged on a surface of the elongated carrier.

BACKGROUND

Efforts have been made to make solid state-based lighting devices, e.g., light-emitting diode (LED) based lighting devices, mimic or resemble traditional incandescent lighting devices, e.g., with respect to light distribution and/or color temperature. In bulb lighting devices based on LEDs, commonly referred to as "retrofit lamps" since these LED lamps are often designed to have the appearance of a traditional incandescent light bulb and to be mounted in conventional sockets, etc., the light emitting filament wire is replaced with one or more LEDs. Such bulb lighting devices based on LEDs may also be referred to as LED bulbs. A LED bulb may for example comprise one or more so-called LED filaments, wherein each LED filament may include multiple LEDs which are connected to each other in series to form a light-emitting filament. Such a LED bulb is hence designed to resemble a traditional incandescent light bulb with visible light-emitting filaments for aesthetic and light distribution purposes, but with the high efficiency of LEDs.

SUMMARY

Improvements of such light-emitting diode (LED) bulbs in terms of increased functionality, increased efficiency, etc. are desired.

In view of the above, a concern of the present invention is to provide a lighting device which includes an elongated carrier and a plurality of LEDs arranged on a major surface of the elongated carrier, which lighting device may be used to realize or implement LED bulbs such as described in the foregoing, and which lighting device is capable of providing an increased functionality and/or an increased efficiency compared to existing LED bulbs.

To address at least one of this concern and other concerns, a LED filament in accordance with the independent claim is provided. Preferred embodiments are defined by the dependent claims.

According to a first aspect of the present invention, a LED filament is provided. The LED filament comprises a plurality of LEDs configured to, in operation, emit LED light having a dominant peak wavelength in a blue wavelength range from 420 nm to 490 nm, a violet wavelength range from 380 nm to 420 nm and/or an ultraviolet wavelength range from 100 nm to 380 nm. The LED filament comprises an elongated carrier comprising a major surface on which the plurality of LEDs are arranged. The LED filament comprises a first enclosing structure at least partly enclosing the plurality of LEDs and at least a portion of the major surface. The first enclosing structure comprises a first body arranged to receive at least some of the LED light (i.e., the light emitted by the plurality of LEDs) emitted by the plurality of LEDs, convey it through the first body and output first LED light. The LED filament comprises a second enclosing structure at least in part enclosing the first enclosing structure. The second enclosing structure comprises a second body arranged to receive at least some of the first LED light, convey it through the second body and output second LED light. The second body comprises one or more wavelength-converting elements configured such that the second LED light has a different spectral light distribution than the first LED light. A thickness of the first enclosing structure (T1) is larger than a thickness of the second enclosing structure (T2) multiplied by two.

Hence, the thickness of the first enclosing structure may be defined throughout the application as T1, and the thickness of the second enclosing structure may be defined throughout the application as T2.

In other words, T1>2T2. Preferably T1>5T2, more preferably T1>8T2, most preferably T1>10T2. The larger the thickness of the first enclosing structure with respect to the thickness of the second enclosing structure, the higher the efficiency of the LED filament may be. However, the ratio between T1 and T2 should not be too large, because the mimicking/resembling of the LED filament to a traditional incandescent lighting device will be lost. Therefore, in accordance with embodiments of the present invention, preferably T1<30T2, more preferably T1<25T2, most preferably T1<20T2. For example, T1 may be in a range from 5 mm to 15 mm. For example, T2 may be in a range from 0.5 mm to 5 mm.

As mentioned, the LED light has a dominant peak wavelength in a blue wavelength range from 420 nm to 490 nm, a violet wavelength range from 380 nm to 420 nm and/or an ultraviolet wavelength range from 100 nm to 380 nm. Thus, in the context of the present application, the term "light" is not limited to visible light, but encompasses at least ultraviolet radiation, which accordingly may be referred to as "ultraviolet light" herein.

The one or more wavelength-converting elements of the second body may for example comprise photo-luminescent material.

As mentioned, the second body comprises one or more wavelength-converting elements configured such that the second LED light has a different spectral light distribution than the first LED light. Due to partial or complete conversion of the wavelength of the LED light upon passing through the second body by means of the one or more wavelength-converting elements of the second body, the spectral light distribution of LED light changes as a result of it passing through the second body. The spectral light distribution of the second LED light is different from that of the first LED light because at least part of the first LED light is converted into wavelength-converted light. The second LED light comprises that wavelength-converted light. The wavelength-converted light preferably has a dominant peak wavelength in the green, yellow and/or red wavelength range, such as in the wavelength range 490 nm-800 nm.

The first enclosing structure is configured such that the first LED light output by the first body is in the same spectral light distribution, or substantially in the same spectral light distribution, as the at least some of the LED light emitted by the plurality of LEDs received by the first body. The first enclosing structure or the first body may possibly include no, or substantially no, wavelength-converting elements or materials. For example, the first enclosing structure or the first body may free, or substantially free, from light converting elements or materials such as photo-luminescent material. The first enclosing structure or the first body may be transparent and arranged to convey LED light therethrough without any wavelength conversion of the LED light.

The elongated carrier may be arranged such that the major surface on which the LEDs are arranged has a reflectivity of at least 85%, for example at least 90% or at least 95%. Possibly, LEDs may be arranged on the major surface of the elongated carrier such that at most 10% of the surface area of the major surface is covered by LEDs.

The elongated carrier may be light transmissive.

The LED filament may be arranged such that the arrangement of at least some components (e.g., the LEDs) on and/or at the major surface of the elongated carrier is repeated, or mirrored, on a surface of the elongated carrier opposite to the major surface.

By a thickness of the first enclosing structure being larger than a thickness of the second enclosing structure multiplied by two, there may be a relatively large distance between the LEDs (at least some of which may be configured to emit, e.g., blue light). This—and in particular in combination with the major surface having a reflectivity of at least 85% and/or by at most 10% of the surface area of the major surface is covered by LEDs—may facilitate or allow for achieving a relatively high efficiency of the LED filament (e.g., by relatively little light and/or ultraviolet light emitted by the LEDs being absorbed by the LEDs).

The LED filament comprises LEDs configured to emit, for example, blue light, violet light and/or ultraviolet light. For example, one or more of the LEDs may be configured to emit blue light, one or more of the LEDs may be configured to emit violet light, and/or one or more of the LEDs may be configured to emit ultraviolet light. The blue light may be light within a wavelength range of 420 nm to 490 nm. The violet light may be light within a wavelength range of 380 nm to 420 nm.

Each or any of the LEDs may be controllable, e.g., with respect to switching on and switching off the LED. One or more groups of LEDs may be individually controllable, e.g., with respect to switching on and switching off the LEDs of the group(s). The LED filament may comprise a controller. The controller may be configured to control operation of the LEDs. The controller may be configured to control operation of the LEDs at least with respect to switching on and switching off each or any of the LEDs.

For example by providing LEDs configured to emit violet light and/or ultraviolet light, disinfection of articles can be accomplished by subjecting the articles to the violet light and/or ultraviolet light emitted by the LEDs, for example of medical instruments and other medical equipment in medical facilities to reduce the transmission of pathogens and prevent the spread of illnesses between individuals.

Each or any of the first enclosing structure and the second enclosing structure may comprise or be constituted by an encapsulant. Possibly, the first enclosing structure may be referred to as a first encapsulant, and the second enclosing structure may be referred to as a second encapsulant.

By a thickness of the first enclosing structure or the second enclosing structure it may be meant a thickness the first enclosing structure or the second enclosing structure in a direction perpendicular to the major surface of the elongated carrier.

At least one of the first enclosing structure and the second enclosing structure may at least in part be formed as a layer.

Possibly, the first enclosing structure and/or the second enclosing structure may comprise or be constituted by a layer. The thickness of the first enclosing structure may be for example be defined as a thickness of the layer or the at least part of the first enclosing structure formed as a layer, or as an average thickness of the layer or the at least part of the first enclosing structure formed as a layer across a major surface of first enclosing structure or first body. The thickness of the second enclosing structure may be defined as a thickness of the layer or the at least part of the second enclosing structure formed as a layer, or as an average thickness of the layer or the at least part of the second enclosing structure formed as a layer across a major surface of second enclosing structure or second body.

For example, the first enclosing structure may be at least in part formed as a layer, which layer may have a thickness within a range from 5 mm to 15 mm. The obtained effect is improved efficiency of the LED filament while it still mimics or resembles a filament of a traditional incandescent lighting device. Inventors have found that the efficiency can be improved by increasing the thickness of the first enclosing structure compared to the thickness of the second enclosing structure.

The second enclosing structure may be patterned. For example, the second enclosing structure may comprise one or more openings, or holes or apertures, etc. Each or any of the one or more openings, holes, apertures, etc. may permit some of the first LED light to be emitted from the LED filament without first having been conveyed through the second body. For example, part of the LED light emitted by the LEDs may be emitted from the LED filament without first having been conveyed through the second body (and hence not through or by the wavelength-converting elements of the second body). In this way, the efficiency of the LED filament may be increased (e.g., by relatively little LED light emitted by the LEDs being absorbed by the LEDs). Further, it may facilitate for achieving a decorative appearance of the LED filament, such as, for example, a coiled appearance.

The second enclosing structure may comprise one or more wires, for example photo-luminescent wires, which may be coiled around at least a part or portion of the first enclosing structure and possibly also around at least a part or portion of the elongated carrier.

As one example, the second enclosing structure may at least in part be formed as a helix or spiral, e.g., a three-dimensional helix or spiral. The second enclosing structure may at least in part be formed as a helix or spiral that preferably has at least three windings, more preferably at least seven windings, and most preferably at least ten windings. For example, the second enclosing structure may at least in part be formed as a helix or spiral around at least a part or portion of the elongated carrier and at least a part or portion of the first enclosing structure. Possibly, the second enclosing structure may comprise or be constituted by a helix or spiral.

The helix or spiral may have a plurality of windings which at least partly may constitute the second body. At least some of the windings may be spaced apart such that gaps are formed between adjacent windings. Each of the gaps may permit some of the first LED light and/or ultraviolet light to be emitted from the LED filament without first having been conveyed through the second body. Each or any of the gaps may have a length G. Each or any of the windings may have a transversal circular cross section perpendicular to a longitudinal direction of the winding, wherein the cross section may have a diameter D. The following may hold: $0.5D<G<2D$. For example, by means of the gaps, part of the light emitted by the LEDs may be emitted from the LED filament without first having been conveyed through the second body (and hence not through or by the wavelength-converting elements of the second body). In this way, the efficiency of the LED filament may be increased (e.g., by relatively little LED light emitted by the LEDs being absorbed by the LEDs).

The second body which may at least partly be constituted by the plurality of windings of a helix or spiral may for example include yellow and red phosphors and optionally blue phosphor.

In case the second enclosing structure is at least in part be formed as a helix or spiral around at least a part or portion of the elongated carrier and at least a part or portion of the first enclosing structure, or comprises or is constituted by a helix or spiral, the thickness of the second enclosing structure may be defined as a difference between an outer diameter and an inner diameter of the helix or spiral, or as an average of differences between an outer diameter and an inner diameter of the helix or spiral taken along a longitudinal axis of the helix or spiral (which in alternative might be referred to as the helix or spiral axis).

The one or more wavelength-converting elements of the second body and possibly the LEDs may be configured such that the second LED light comprises yellow light and red light, but possibly no blue light, or substantially no blue light (e.g., such that less than 5% of the second LED light has a dominant peak wavelength in a blue wavelength range from 420 to 490 nm). For example, the one or more wavelength-converting elements of the second body may comprise yellow and red phosphors.

The one or more wavelength-converting elements of the second body and possibly the LEDs may be configured such that the second LED light comprises yellow light, red light and blue light. For example, the one or more wavelength-converting elements of the second body may comprise yellow, red and blue phosphors.

The plurality of LEDs may comprise at least one first LED and at least one second LED. Each of the first LED(s) may be configured to emit blue light. Each of the second LED(s) may be configured to emit violet light or ultraviolet light. According to one example, the plurality of LEDs may consist of one or more LEDs configured to emit blue light and one or more LEDs configured to emit violet light. According to another example, the plurality of LEDs may consist of one or more LEDs configured to emit blue light and one or more LEDs configured to emit ultraviolet light.

At least some of the LEDs may be arranged in a two-dimensional array on the major surface (e.g., as seen from above the major surface) such that the at least some of the LEDs are distributed along a longitudinal direction of the elongated carrier and along a direction perpendicular to the longitudinal direction. A distance between adjacent LEDs in the two-dimensional array in at least one of the longitudinal direction and the direction perpendicular to the longitudinal direction may be (i) larger than a length of the LEDs along the one of the longitudinal direction and the direction perpendicular to the longitudinal direction multiplied by two and (ii) smaller than the thickness of the first enclosing structure. Arranging at least some of the LEDs may be arranged in such a two-dimensional array may result in a relatively large distance between adjacent LEDs. This—and in particular in combination with the major surface having a reflectivity of at least 85%—may further facilitate for achieving a relatively high efficiency of the LED filament (e.g., by relatively little light and/or ultraviolet radiation emitted by the LEDs being absorbed by the LEDs).

The LED filament (or, e.g., the LEDs thereof) may be arranged such that light emitted from the LED filament has a correlated color temperature (CCT) of less than 2500 K.

Some of the LEDs may be configured to emit blue light, and those LEDs may be distributed in the two-dimensional array as described in the foregoing. By arranging at least some of the LEDs in a two-dimensional array as described in the foregoing and by a CCT of light emitted from the LED filament of less than 2500 K the LEDs configured to emit blue light distributed in the two-dimensional array may not be visible to the naked eye of a viewer.

The elongated carrier may for example be flexible.

The LED filament may comprise a third enclosing structure which may be at least in part enclosing the second enclosing structure. The third enclosing structure may comprise a third body arranged to receive at least some of the second LED light, convey it through the third body and output third LED light. The third body may comprise one or more wavelength-converting elements configured such that the third LED light has a different spectral light distribution than the second LED light. Such a third enclosing structure may further facilitate achieving a relatively high efficiency of the LED filament (e.g., by relatively little LED light emitted by the LEDs being absorbed by the LEDs). The spectral light distribution of the third LED light is different from that of the second LED light because at least part of the second LED light is converted into wavelength-converted light. The third LED light comprises that wavelength-converted light.

The third enclosing structure may comprise an encapsulant. Possibly, the third enclosing structure may be referred to as a third encapsulant.

The one or more wavelength-converting elements of the second body and possibly the LEDs may be configured such that the third LED light comprises red light, and the one or more wavelength-converting elements of the third body may be configured such that the third LED light comprises yellow light and/or red light. For example, the one or more wavelength-converting elements of the second body may comprise red phosphor and the one or more wavelength-converting elements of the third body may comprise yellow phosphor and/or red phosphor.

The third body may comprise light scattering particles, which for example may provide an off-state white appearance of the LED filament. In alternative or in addition, the first body may comprise light scattering particles.

According to a second aspect of the present invention, a LED lamp is provided. The LED lamp comprises at least one LED filament according to the first aspect of the present invention. The LED lamp may comprise a base, which may be configured to electrically and mechanically connect the LED lamp to a luminaire, e.g., to a socket of a luminaire. The LED lamp may comprise a transmissive envelope that may be coupled to the base and that may be at least partly enclosing the at least one LED filament. Alternatively, said LED lamp may comprise at least one LED filament according to the first aspect of the present invention.

Hence, in an embodiment, the LED lamp comprises a plurality of LED filaments according to the first aspect of the invention. The plurality of LED filaments may be arranged in spatial relation relative to each other, for example parallel to each other, or for example skewed under an angle relative to each other, or for example extending towards or from a mutual starting point or mutual starting line/contour. Having a plurality of such LED filaments according to the first aspect of the present invention may be advantageous, as the first LED light of a first LED filament may illuminate the second body of a second LED filament, and thereby still at least partly be converted to a second LED light, thereby improving efficiency while maintaining the illumination appearance of the LED filament.

Photo-luminescent material should, in the context of the present application, be understood as any material that is capable of light emission from the material after its absorption of photons. Examples of photo-luminescent materials which may be used in conjunction with embodiments of the present invention may for example include at least one phosphor or a mixture or aggregate of several different phosphors, and/or quantum confinement structures. The term "quantum confinement structures" should, in the context of the present application, be understood as, e.g., quantum wells, quantum dots, quantum rods, or nano-wires. A quantum well is a potential well with only discrete energy values and may be formed in semiconductors by having a material, like gallium arsenide or indium gallium nitride sandwiched between two layers of a material with a wider band gap, like aluminum arsenide or gallium nitride. Quantum dots (or rods, or nano-wires) are small crystals of semiconducting material generally having a size, e.g. width, radius or diameter, of only a few nanometers. When excited by incident light, a quantum dot emits light of a color determined by the size and material of the crystal. Light of a particular color can therefore be produced by adapting the size and/or material of the quantum dots. Most known quantum dots with emission in the visible range of the electromagnetic spectrum are based on cadmium selenide (CdSe) with a shell (or shells) such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots generally have very narrow emission band and can thus provide saturated colors. Furthermore, the color of emitted light can be tuned by adapting the size of the quantum dots. It is to be understood that any type of quantum confinement structures may be used in embodiments of the present invention, provided that the quantum confinement structures have the appropriate wavelength conversion characteristics. However, it may be preferred for reasons of environmental safety and concern to use cadmium-free quantum confinement structures or at least quantum confinement structures having relatively low cadmium content.

The second enclosing structure or the body of the second enclosing structure (e.g., the second body) may comprise a thermally conductive filler configured to transport heat. For example, heat may be transported from the first enclosing structure to the ambient. Hence, such configurations are advantageous, as the second enclosing structure (or the body of the second enclosing structure) may render an increased surface area exposure to the ambient for heat transport, particularly if spiraling around the first enclosing structure. Moreover, the second enclosing structure (or body of the second enclosing structure) may thus comprise the wavelength-converting elements and render said converted light, while having an improved thermal dissipation function due to the thermally conductive filler also within said second enclosing structure (or body of the second enclosing structure).

The previously mentioned controller, which in alternative could be referred to as a control unit, a control device, etc., may for example include or be constituted by any suitable central processing unit (CPU), microcontroller, digital signal processor (DSP), Application Specific Integrated Circuit (ASIC), Field Programmable Gate Array (FPGA), etc., or any combination thereof. The controller may optionally be capable of executing software instructions stored in a computer program product, e.g., in the form of a memory. The memory may for example be any combination of read and write memory (RAM) and read only memory (ROM). The memory may comprise persistent storage, which for example can be a magnetic memory, an optical memory, a solid state memory or a remotely mounted memory, or any combination thereof.

A LED filament may be providing LED filament light and comprises a plurality of light emitting diodes (LEDs) which may be arranged in a linear array. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier (such as the elongated carrier as described above) like for instance a substrate, that may be rigid (made from, e.g., a polymer, glass, quartz, metal or sapphire) or flexible (e.g., made of a polymer or metal, e.g., a film or foil).

In case the carrier comprises a first major surface and an opposite second major surface, the LEDs may be arranged on at least one of these surfaces. The carrier may be reflective or light transmissive, such as translucent and preferably transparent.

The LED filament may comprise an encapsulant at least partly covering at least part of the plurality of LEDs. The encapsulant, which may be considered as an example of the first enclosing structure as described herein, may also at least partly cover at least one of the first major or second major surface. The encapsulant may be a polymer material which may be flexible such as for example a silicone. Further, the LEDs may be arranged for emitting LED light, e.g., of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

Each or any one of the LEDs may for example include or be constituted by an inorganic LED and/or an organic LED (OLED). Solid state light emitters are relatively cost-efficient light sources since they in general are relatively inexpensive and have a relatively high optical efficiency and a relatively long lifetime. Examples of LEDs include semiconductor, organic, or polymer/polymeric LEDs, optically pumped phosphor coated LEDs, optically pumped nano-crystal LEDs or any other similar devices as would be readily understood by a person skilled in the art. For example, the term LED can encompass a bare LED die arranged in a housing, which may be referred to as a LED package. According to another example, the term LED can encompass a Chip Scale Package (CSP) LED, which may comprise a LED die directly attached to a substrate such as a PCB, and not via a sub-mount. The term LED can for example encompass a laser diode, because a laser diode is a diode which emits light.

Further objects and advantages of the present invention are described in the following by means of exemplifying embodiments. It is noted that the present invention relates to all possible combinations of features recited in the claims. Further features of, and advantages with, the present invention will become apparent when studying the appended claims and the description herein. Those skilled in the art realize that different features of the present invention can be combined to create embodiments other than those described herein.

BRIEF DESCRIPTION OF THE DRAWINGS

Exemplifying embodiments of the invention will be described below with reference to the accompanying drawings.

Figure 1:
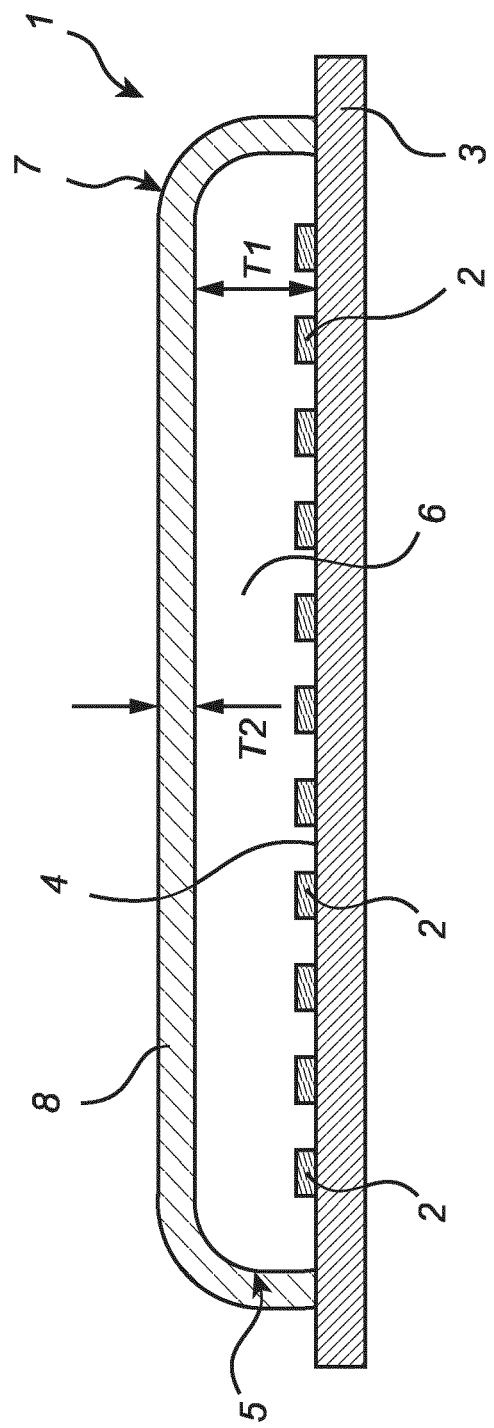
FIGS. 1 to 3 are schematic side views of light-emitting diode (LED) filaments according to embodiments of the present invention.

All the figures are schematic, not necessarily to scale, and generally only show parts which are necessary in order to elucidate embodiments of the present invention, wherein other parts may be omitted or merely suggested.

DESCRIPTION WITH REFERENCE TO THE DRAWINGS

The present invention will now be described hereinafter with reference to the accompanying drawings, in which exemplifying embodiments of the present invention are shown. The present invention may, however, be embodied in many different forms and should not be construed as limited to the embodiments of the present invention set forth herein; rather, these embodiments of the present invention are provided by way of example so that this disclosure will convey the scope of the invention to those skilled in the art. In the drawings, identical reference numerals denote the same or similar components having a same or similar function, unless specifically stated otherwise.

FIG. 1 is a schematic view of a light-emitting diode (LED) filament 1 according to an embodiment of the present invention. The LED filament 1 comprises a plurality of LEDs 2. The plurality of LEDs 2 may be configured to, in operation, emit LED light having a dominant peak wavelength in a blue wavelength range from 420 to 490 nm, a violet wavelength range from 380 to 420 nm and/or an ultraviolet wavelength range from 100 nm to 380 nm. Only some of the LEDs 2 are indicated by a reference numeral in FIG. 1. It is to be understood that the number of LEDs 2 illustrated in FIG. 1 is exemplifying, and the LED filament 1 may comprise fewer or more LEDs than illustrated in FIG. 1. The LED filament 1 may in principle comprise any number of LEDs.

The LED filament 1 further comprises an elongated carrier 3, which comprises a major surface 4 on which the plurality of LEDs 2 are arranged.

In general, the LED filament 1 further comprises a first enclosing structure, which is at least partly enclosing the plurality of LEDs 2 and at least a portion of the major surface 4, and the first enclosing structure comprising a first body arranged to receive at least some of the LED light emitted by the plurality of LEDs 2, convey it through the first body and output first LED light. In accordance with the embodiment of the present invention illustrated in FIG. 1, the LED filament 1 comprises a first enclosing structure 5 that is enclosing the LEDs 2 and a portion of the major surface 4 and comprises a first body 6 arranged to receive the LED light emitted by the LEDs 2, convey it through the first body 5 and output first LED light.

In general, the LED filament 1 further comprises a second enclosing structure, which is at least in part enclosing the first enclosing structure and comprises a second body 8 arranged to receive at least some of the first LED light, convey it through the second body and output second LED light. In accordance with the embodiment of the present invention illustrated in FIG. 1, the LED filament 1 comprises a second enclosing structure 7 enclosing the first enclosing structure 5 and comprising a second body 8 arranged to receive the first LED light, convey it through the second body 8 and output second LED light.

The second body 8 comprises one or more wavelength-converting elements configured such that the second LED light has a different spectral light distribution than the first LED light. That is, the spectral light distribution the light output by the second body 8 is different from the spectral light distribution of the light received by the second body 8.

A thickness T1 of the first enclosing structure 5 is larger than a thickness T2 of the second enclosing structure 7 multiplied by two, i.e., $T1 > 2T2$.

In accordance with the embodiment of the present invention illustrated in FIG. 1, both the first enclosing structure 5 (or first body 6) and the second enclosing structure 7 (or second body 8) are formed as layers of uniform or substantially uniform thickness T1 and T2, respectively.

Figure 2:
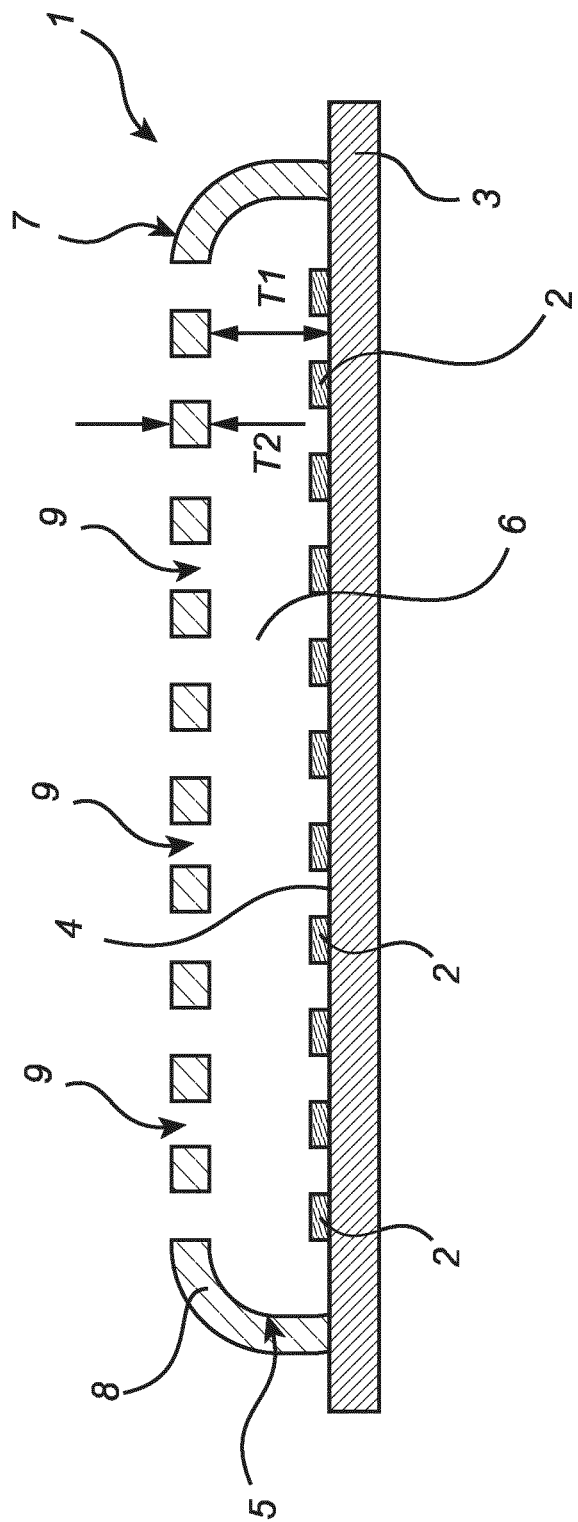

FIG. 2 is a schematic view of a LED filament 1 according to an embodiment of the present invention. The LED filament 1 illustrated in FIG. 2 is similar to the LED filament 1 illustrated in FIG. 1, and the same reference numerals in FIGS. 1 and 2 denote the same or similar components having the same or similar function.

The LED filament 1 illustrated in FIG. 2 differs from the LED filament 1 illustrated in FIG. 1 in that the LED filament 1 illustrated in FIG. 2 has a second enclosing structure 7 that comprises openings 9. Only some of the openings 9 are indicated by a reference numeral in FIG. 2. The openings 9 permit some of the first LED light output by the first body 6 to be emitted from the LED filament 1 without first having been conveyed through the second body 8.

Figure 3:
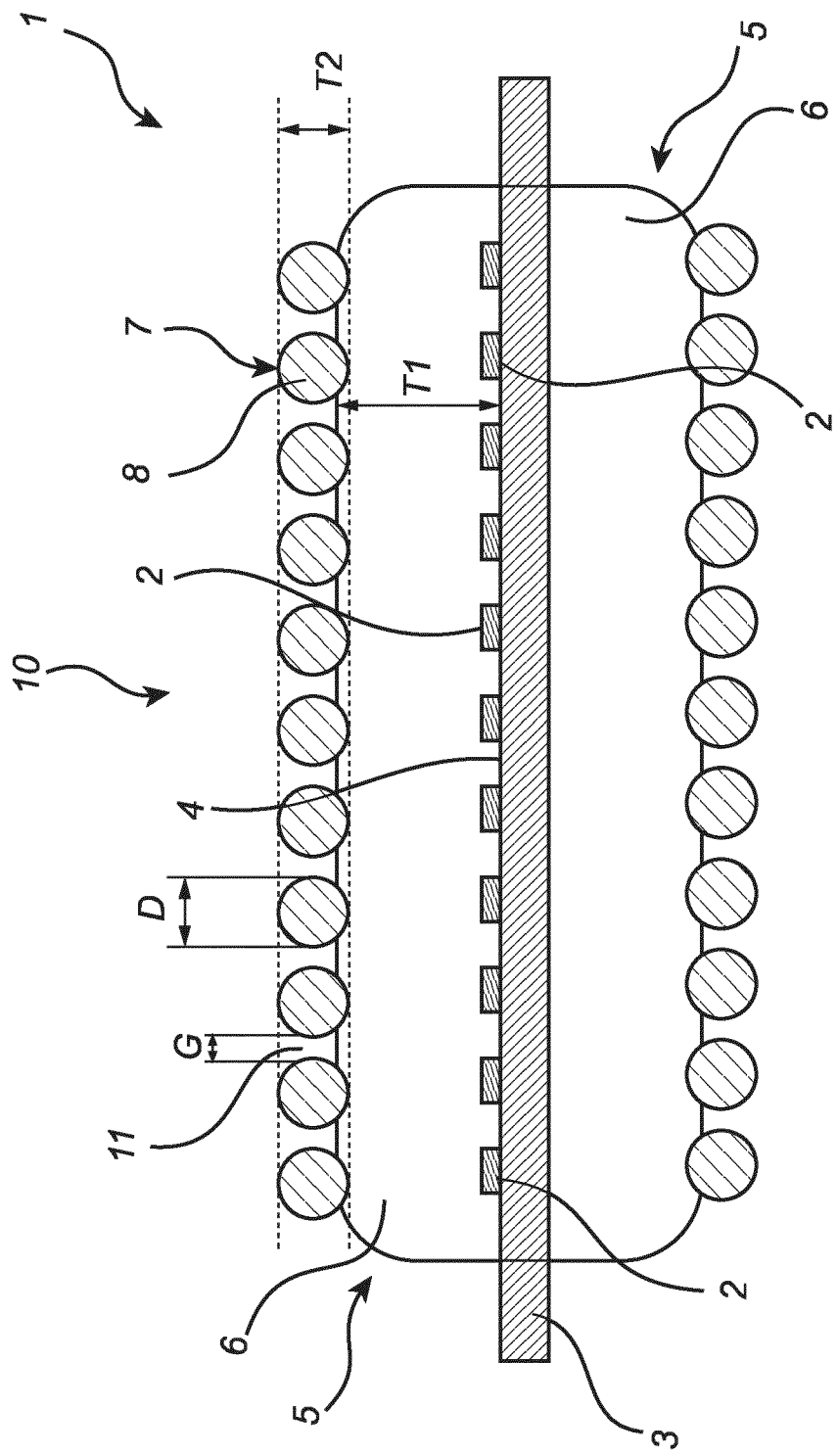

FIG. 3 is a schematic view of a LED filament 1 according to an embodiment of the present invention. Similarly to the LED filaments 1 illustrated in FIGS. 1 and 2, the LED filament 1 illustrated in FIG. 3 comprises a plurality of LEDs 2 which may be configured to, in operation, emit LED light having a dominant peak wavelength in a blue wavelength range from 420 nm to 490 nm, a violet wavelength range from 380 nm to 420 nm and/or an ultraviolet wavelength range from 100 nm to 380 nm. Only some of the LEDs 2 are indicated by a reference numeral in FIG. 3. It is to be understood that the number of LEDs 2 illustrated in FIG. 3 is exemplifying, and the LED filament 1 may comprise fewer or more LEDs than illustrated and in principle any number of LEDs. Just as the LED filaments 1 illustrated in FIGS. 1 and 2, the LED filament 1 illustrated in FIG. 3 also comprises an elongated carrier 3 that comprises a major surface 4 on which the LEDs 2 are arranged.

The LED filament 1 illustrated in FIG. 3 comprises a first enclosing structure 5 enclosing the LEDs 2, a portion of the major surface 4 and a portion of a surface of the elongated carrier 3 that is opposite to the major surface 4. The first enclosing structure 5 comprises a first body 6 arranged to receive the LED light emitted by the LEDs 2, convey it through the first body 6 and output first LED light.

The LED filament 1 illustrated in FIG. 3 further comprises a second enclosing structure 7 enclosing the first enclosing structure 5 and comprising a second body 8 arranged to receive some of the first LED light, convey it through the second body 8 and output second LED light. The second body 8 comprises one or more wavelength-converting elements configured such that the second LED light has a different spectral light distribution than the first LED light. In accordance with the embodiment of the present invention illustrated in FIG. 3, the second enclosing structure 7 is formed as a helix or spiral having a plurality of windings 10 which constitute the second body 8. The windings 10 are spaced apart such that gaps 11 are formed between adjacent ones of the windings 10. Each of the gaps 11 permits some of the first LED light to be emitted from the LED filament 1 without first having been conveyed through the second body 8. As illustrated in FIG. 3, each of the gaps 11 has a length G, and each of the windings 11 has a transversal circular cross section perpendicular to a longitudinal direction of the winding 11, which cross section has a diameter D. In accordance with the embodiment of the present invention illustrated in FIG. 3, the following holds: $0.5D<G<2D$.

Figure 4:
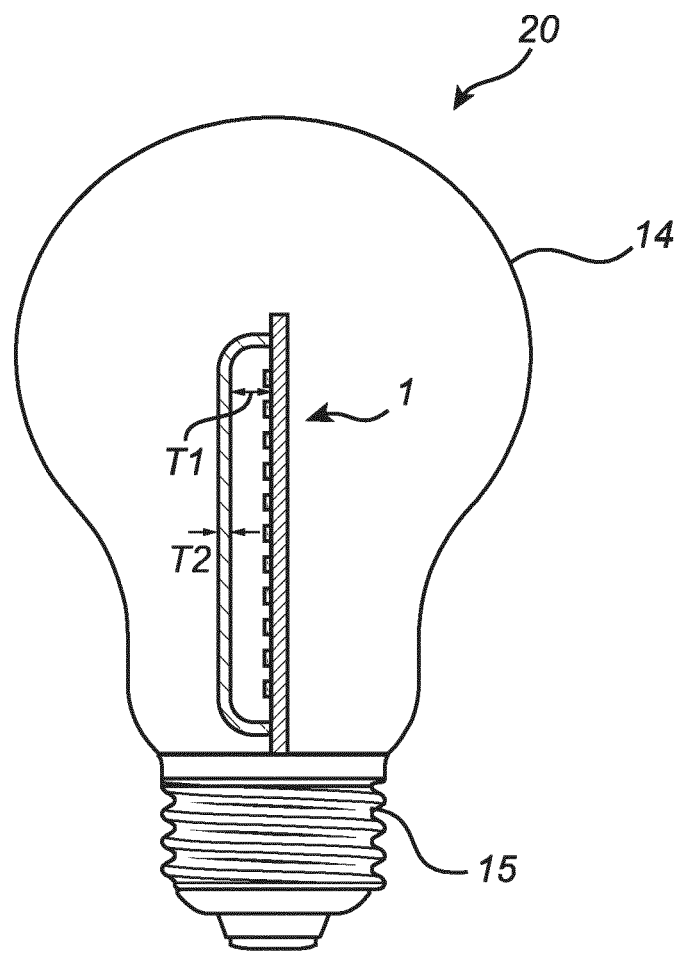
FIG. 4 is a schematic view of a LED lamp according to an embodiment of the present invention.

FIG. 4 is a schematic view of a LED lamp 20 according to an embodiment of the present invention. The LED lamp 20 comprises a LED filament 1 according to an embodiment of present invention, e.g., a LED filament 1 as illustrated in any one of FIGS. 1 to 3. In accordance with the embodiment of the present invention illustrated in FIG. 4, the LED lamp 20 comprises a LED filament 1 as illustrated in FIG. 1. The LED lamp 20 comprises a base 15, which may be configured to electrically and mechanically connect the LED lamp 1 to a luminaire (not shown in FIG. 4), e.g., to a socket of a luminaire. The LED lamp 20 comprises a transmissive envelope 14 (e.g., a light-transmissive envelope) that is coupled to the base 15 and is at least in part enclosing the LED filament 1. The transmissive envelope 14 may for example be made of glass. The base 15 may include or be constituted by any suitable type of coupler or connector, for example an Edison screw base, a bayonet fitting, or any other type of connection which may be suitable for the particular type of luminaire. The LED lamp 20 or the LED filament 1 may comprise a controller (not shown in FIG. 4) which may be configured to control operation of the LEDs of the LED filament 1. The controller may be configured to control operation of the LEDs of the LED filament 1 at least with respect to switching on and switching off each or any of the LEDs.

In conclusion, a LED filament is disclosed, comprising a plurality of LEDs configured to, in operation, emit LED light, and an elongated carrier comprising a major surface on which the plurality of LEDs are arranged. The LED filament comprises a first enclosing structure, comprising a first body arranged to receive at least some of the LED light emitted by the plurality of LEDs, convey it through the first body and output first LED light, and a second enclosing structure, comprising a second body arranged to receive at least some of the first LED light, convey it through the second body and output second LED light, wherein the second body comprises one or more wavelength-converting elements. A thickness (T1) of the first enclosing structure is larger than a thickness (T2) of the second enclosing structure multiplied by two.

While the present invention has been illustrated in the appended drawings and the foregoing description, such illustration is to be considered illustrative or exemplifying and not restrictive; the present invention is not limited to the disclosed embodiments. Other variations to the disclosed embodiments can be understood and effected by those skilled in the art in practicing the claimed invention, from a study of the drawings, the disclosure, and the appended claims. In the appended claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting diode, LED, filament comprising:
a plurality of LEDs configured to, in operation, emit LED light having a dominant peak wavelength in a blue wavelength range from 420 nm to 490 nm, a violet wavelength range from 380 nm to 420 nm and/or an ultraviolet wavelength range from 100 nm to 380 nm;
an elongated carrier comprising a major surface on which the plurality of LEDs are arranged;
a first enclosing structure at least partly enclosing the plurality of LEDs and at least a portion of the major surface, the first enclosing structure comprising a first body being arranged to receive at least some of the LED light emitted by the plurality of LEDs, convey it through the first body and output first LED light; and
a second enclosing structure at least in part enclosing the first enclosing structure, the second enclosing structure comprising a second body being arranged to receive at least some of the first LED light, convey it through the second body and output second LED light, wherein the second body comprises one or more wavelength-converting elements configured such that the second LED light has a different spectral light distribution than the first LED light;
wherein a thickness, T1, of the first enclosing structure is larger than a thickness, T2, of the second enclosing structure multiplied by two, and
wherein the second enclosing structure comprises one or more openings (9) each of which permits some of the first LED light to be emitted from the LED filament without first having been conveyed through the second body.

2. A LED filament according to claim 1, wherein the first enclosing structure is at least in part formed as a layer, and wherein T1 is within a range from 5 mm to 15 mm.

3. A LED filament according to claim 1, wherein the second enclosing structure is at least in part formed as a helix or spiral, the helix or spiral having a plurality of windings at least partly constituting the second body, wherein at least some of the windings are spaced apart such that gaps are formed between adjacent ones of the windings, wherein each of the gaps permits some of the first LED light to be emitted from the LED filament without first having been conveyed through the second body.

4. A LED filament according to claim 3, wherein each of the gaps has a length G and each of the windings has a transversal circular cross section perpendicular to a longitudinal direction of the winding, the cross section having a diameter D, wherein $0.5D<G<2D$.

5. A LED filament according to claim 3, wherein the second enclosing structure is at least in part formed as a helix or spiral having at least three windings.

6. A LED filament according to claim 1, wherein the first enclosing structure is configured such that the first LED light output by the first body is in the same spectral light distribution as the at least some of the LED light emitted by the plurality of LEDs received by the first body.

7. A LED filament according to claim 1, wherein the LEDs and the one or more wavelength-converting elements of the second body are configured such that the second LED light comprises yellow light and/or red light but not blue light.

8. A LED filament according to claim 1, wherein the LEDs and the one or more wavelength-converting elements of the second body are configured such that the second LED light comprises yellow light, red light and blue light.

9. A LED filament according to claim 1, wherein the plurality of LEDs comprises at least one first LED, wherein the at least one first LED(s) is configured to emit blue light, and at least one second LED, wherein the at least one second LED(s) is configured to emit violet light or ultraviolet light.

10. A LED filament according to claim 1, wherein at least some of the LEDs are arranged in a two-dimensional array on the major surface such that the at least some of the LEDs are distributed along a longitudinal direction of the elongated carrier and along a direction perpendicular to the longitudinal direction, wherein a distance between adjacent LEDs in the two-dimensional array in at least one of the longitudinal direction and the direction perpendicular to the longitudinal direction is (i) larger than a length of the LEDs along the one of the longitudinal direction and the direction perpendicular to the longitudinal direction multiplied by two and (ii) smaller than the thickness of the first enclosing structure.

11. A LED filament according to claim 1, further comprising:

a third enclosing structure at least in part enclosing the second enclosing structure, the third enclosing structure comprising a third body being arranged to receive at least some of the second LED light, convey it through the third body and output third LED light, wherein the third body comprises one or more wavelength-converting elements configured such that the third LED light has a different spectral light distribution than the second LED light.

12. A LED filament according to claim 11, wherein the LEDs and the one or more wavelength-converting elements of the second body are configured such that the third LED light comprises red light, and the one or more wavelength-converting elements of the third body are configured such that the third LED light comprises yellow and/or red light.

13. A LED filament according to claim 11, wherein the third body comprises light scattering particles.

14. A light-emitting diode, LED, lamp, the LED lamp comprising:
    at least one LED filament according to claim 1;
    a base configured to electrically and mechanically connect the LED lamp to a socket of a luminaire; and
    a transmissive envelope coupled to the base and at least partly enclosing the at least one LED filament.

* * * * *